(12) United States Patent
Cha et al.

(10) Patent No.: US 8,184,496 B2
(45) Date of Patent: May 22, 2012

(54) SEMICONDUCTOR DEVICE AND METHOD FOR OPERATING THE SAME

(75) Inventors: Jin-Youp Cha, Gyeonggi-do (KR); Sang-Jin Byun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 326 days.

(21) Appl. No.: 12/648,317

(22) Filed: Dec. 29, 2009

(65) Prior Publication Data

US 2011/0158025 A1    Jun. 30, 2011

(30) Foreign Application Priority Data

Dec. 24, 2009   (KR) .................. 10-2009-0130709

(51) Int. Cl.
*G11C 17/16* (2006.01)
(52) U.S. Cl. ............... 365/225.7; 365/189.07; 365/200; 327/526
(58) Field of Classification Search .............. 365/96; 327/526
See application file for complete search history.

(56) References Cited

U.S. PATENT DOCUMENTS

| 6,704,226 B2 * | 3/2004 | Lee ............................ 365/200 |
| 6,838,926 B2 * | 1/2005 | Jung et al. .................. 327/525 |
| 7,902,903 B2 * | 3/2011 | Rosik et al. ................ 327/525 |

FOREIGN PATENT DOCUMENTS

| KR | 10-2004-0061836 | 7/2004 |
| KR | 10-2008-0060674 | 7/2008 |

OTHER PUBLICATIONS

Notice of Allowance issued from Korean Intellectual Property Office on Nov. 30, 2011.

* cited by examiner

*Primary Examiner* — Tan T. Nguyen
(74) *Attorney, Agent, or Firm* — IP & T Group LLP

(57) ABSTRACT

A semiconductor device includes a sensing unit configured to sense whether a value of a programming sensing node is within a predefined range, a fuse connected to the programming sensing node, a programming voltage supplying unit configured to supply a programming voltage to the programming sensing node, and a transferring unit configured to transfer the value of the programming sensing node in response to the sensing result of the sensing unit.

13 Claims, 3 Drawing Sheets

SEMICONDUCTOR DEVICE AND METHOD FOR OPERATING THE SAME

CROSS-REFERENCE TO RELATED APPLICATIONS

The present application claims priority of Korean Patent Application No. 10-2009-0130709, filed on Dec. 24, 2009, which is incorporated herein by reference in its entirety.

BACKGROUND OF THE INVENTION

Exemplary embodiments of the present invention relate to a semiconductor device, and more particularly, to a fuse circuit of a semiconductor device.

In typical memory devices, a large number of memory cells are integrated into a single chip. When a defect occurs in any one of the memory cells, an entire memory chip is discarded as a defective product. The current trend is to integrate a larger number of memory cells into a chip having a limited size in order to increase the integration density of memory devices. This goal is frustrated, if an entire memory chip is discarded as a defective product even when a defect occurs in any one of memory cells. In this case, the number of memory chips to be discarded as defective products will increase causing inefficient production of semiconductor memory devices.

To solve these limitations, a typical semiconductor memory device is provided with a redundant cell, as well as, a fuse circuit. The fuse circuit includes a plurality of fuses, and a defective cell is replaced with a redundant cell according to a blowing of a fuse in a repair process. A redundant cell and a fuse circuit are formed in a spare space during a semiconductor fabrication process. A repair process is performed to replace a defective memory cell with a redundant cell.

Fuses are classified into physical fuses and electrical fuses. A method using physical fuses performs a repair process to selectively cut fuses by irradiating a laser beam onto the fuses at a wafer level where a semiconductor process is completed. The disadvantage of the physical fuses is that the repair process can be performed only at the wafer level, that is, before the semiconductor memory device is fabricated in a package.

To address this disadvantage, electrical fuses are used. Fuses which are programmable at a package level are generally referred to as electrical fuses. The electrical fuses may be programmed by electrically changing the fuse connection state. The electrical fuses may be classified into anti-type fuses, which change from an open state to a short state, and blowing-type fuses, which change from a short state to an open state.

The electrical fuses are preferred over physical fuses with respect to yield management because they can be programmed after packaging. However, since the electrical fuses are processed at the package level, it is impossible to confirm the connection states of the programmed fuses with naked eyes, as opposed to the physical fuses which are processed at the wafer level. In order to confirm the connection states of the electrical fuses, the package must be removed. However, if the finished package is removed for testing purposes, the value of the finished product is degraded and the efficacy of the test is lowered.

SUMMARY OF THE INVENTION

Exemplary embodiments of the present invention are directed to a semiconductor device including a fuse circuit which may efficiently determine a programmed fuse state.

In accordance with an embodiment of the present invention, a semiconductor device includes a sensing unit configured to sense whether a value of a programming sensing node is within a predefined range, a fuse connected to the programming sensing node, a programming voltage supplying unit configured to supply a programming voltage to the programming sensing node, and a transferring unit configured to transfer the value of the programming sensing node in response to the sensing result of the sensing unit.

In accordance with another embodiment of the present invention, a method for operating a semiconductor device which includes a fuse and performs a repair process includes providing a programming voltage to the fuse through a programming sensing node, sensing whether a value of the programming sensing node is within a predefined range, and transferring the value of the programming sensing node as a fuse programming result signal when the value of the programming sensing node is within the predefined range.

DESCRIPTION OF SPECIFIC EMBODIMENTS

Figure 1:
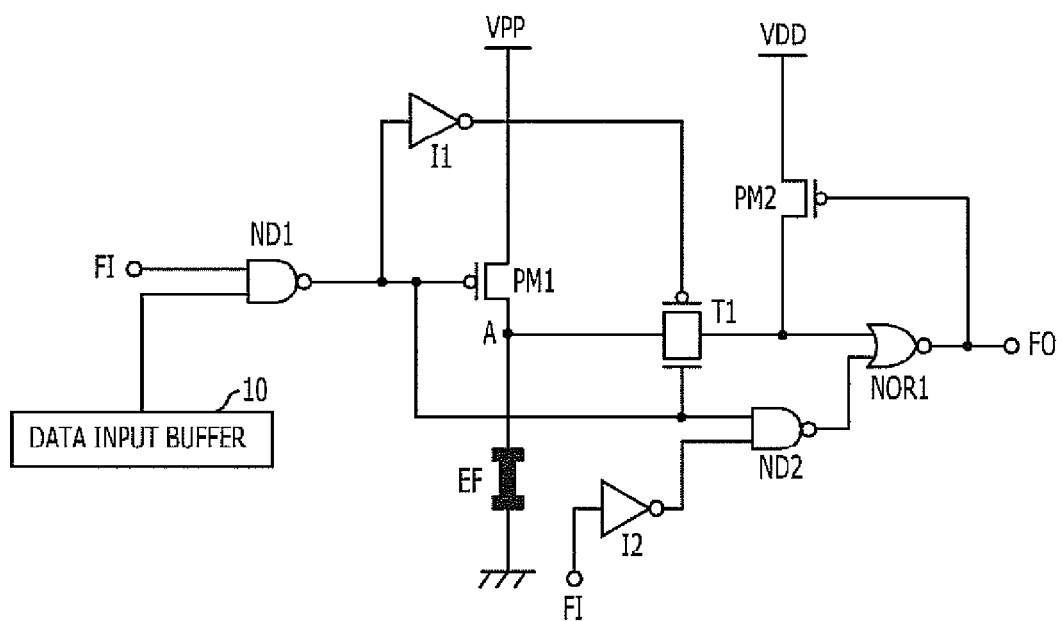
FIG. 1 is a circuit diagram of a fuse circuit of a semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A fuse circuit may provide an exact output value by detecting the degree of a stress applied to the fuses during a repair operation using electrical fuses.

The electrical fuses are programmed by an electrical stress, and the programmed fuses have various resistances. The programmed fuses may not have a predefined output value during the process of sensing the resistances of the fuses. In order to prevent this limitation, an appropriate output value of the fuse circuit is obtained by comparing a voltage having a predetermined boundary with a voltage generated by a resistance of a fuse during the sensing process. The exemplary embodiments of the present invention are applicable to a variety of semiconductor devices, specifically semiconductor memory devices.

FIG. 1 is a circuit diagram of a fuse circuit of a semiconductor device.

Referring to FIG. 1, the fuse circuit includes a data input buffer 10, NAND gates ND1 and ND2, MOS transistors PM1 and PM2, a transmission gate T1, inverters I1 and I2, an electrical fuse EF, and a NOR gate NOR1.

The NAND gate ND1 is configured to perform a NAND operation on a fuse input signal FI and an output signal of the data input buffer 10, and output the resulting signal to a gate of the MOS transistor PM1, the inverter I1, and the NAND gate ND2. The electrical fuse EF has one terminal connected to a ground voltage terminal, and the other terminal connected to a node A.

The MOS transistor PM1 is connected between a high voltage (VPP) supply terminal and the node A and configured to receive an output signal of the NAND gate ND1 through a gate thereof. The transmission gate T1 is configured to selectively transfer the signal of the node A according to the output signal of the NAND gate ND1. The NAND gate ND2 is configured to perform a NAND operation on the inverted signal of the fuse input signal FI and the output signal of the NAND gate ND1 and output the resulting signal to the NOR gate NOR1.

The NOR gate NOR1 is configured to perform a NOR operation on the output signal of the NAND gate ND2 and the signal transferred from the transmission gate T1, and output the fuse output signal FO. The MOS transistor PM2 is configured to provide a power supply voltage VDD to the input terminal of the NOR gate NOR1 according to an output value of the fuse output signal FO. The high voltage VPP is a voltage higher than the power supply voltage VDD used as a driving voltage of the semiconductor device. In this embodiment, the high voltage VPP is supplied in order to apply a high voltage to the input terminal of the electrical fuse EF.

The operation of the semiconductor device illustrated in FIG. 1 will be described below.

The fuse EF of FIG. 1 is an electrical fuse which is programmed by applying an electrical stress, as opposed to a fuse which is cut by irradiating a laser beam. Examples of electrical fuses include a metal fuse, an oxide fuse, and a cell capacitance fuse. The electrical fuses may be classified into anti-type fuses and blowing-type fuses. The conditions of the electrical stress for programming are different according to the fuse types.

The fuse EF of FIG. 1 is an anti-type fuse which maintains a high resistance and has a low resistance after programming. When the NAND gate ND1 receives the fuse input signal FI, which is activated to a high level, and an output signal of the data input buffer 10, which is activated to a high level for selecting a fuse to be programmed, the NAND gate ND1 provides a signal activated to a low level, so that the MOS transistor PM1 is turned on. Thus, the high voltage VPP is applied to one terminal of the electrical fuse EF, and the oxide property of the electrical fuse EF breaks down. Consequently, the resistance of the electrical fuse EF is reduced. When the fuse programming operation is completed, the fuse input signal FI of a low level is inputted and the transmission gate T1 is turned on, so that the signal of the node A is transferred. Transferring the signal of the node A allows the state of the electrical fuse EF to be sensed.

However, unlike the method of blowing the fuse by a laser irradiation, when a repair address is programmed during a repair process by using the electrical fuse, the state of the electrical fuse EF is greatly changed according to the strength of the electrical stress applied to the electrical fuse EF. That is, it is difficult to know whether the electrical fuse has an exact predefined resistance according to a voltage and a current amount applied to the electrical fuse EF and a time taken to apply the voltage and the current amount to the electrical fuse EF.

Since it is impossible to know the exact strength of the electrical stress applied to the electrical fuse EF, the electrical fuse EF may be over-programmed or under-programmed. For example, in the case of an antifuse, which must break down oxide used as the fuse EF, if the resistance of the fuse after programming is too small, a larger amount of a current than a current intended to be sensed flows through the node A connected to the fuse. Due to heat generated at that time, the oxide used as the fuse EF may be reoxidized. Furthermore, when the fuse EF is not perfectly programmed and the oxide does not break down, the sensing is not achieved with a desired result and state. Consequently, a value different from a value desired in the programming step may be outputted in the sensing step.

In order to obtain the exact output value after the programming of the electrical fuse, the semiconductor device in accordance with the embodiment of the present invention determines whether the voltage of the node connected to the fuse, after the fuse programming, is within a predefined voltage range, and normally outputs the fuse output signal FO when the voltage of the node is within the predefined voltage range.

Figure 2:
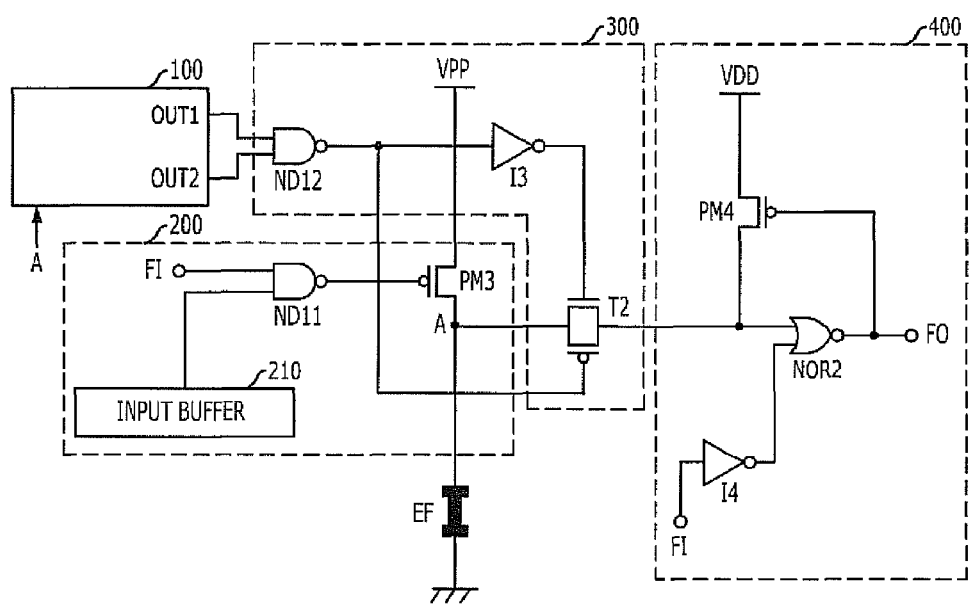
FIG. 2 is a circuit diagram of a semiconductor device in accordance with an embodiment of the present invention.

FIG. 2 is a circuit diagram of a semiconductor device in accordance with an embodiment of the present invention.

Referring to FIG. 2, the semiconductor device in accordance with the embodiment of the present invention includes a sensing unit 100, a fuse EF, a programming voltage supplying unit 200, a transferring unit 300, and a fuse output signal outputting unit 400.

The sensing unit 100 is configured to sense whether a voltage of a programming sensing node A is within a predefined range. When the value of the programming sensing node A is within the predefined range, the sensing unit 100 outputs a first sensing signal OUT1 and a second sensing signal OUT2. The fuse EF is an electrical fuse and has one terminal connected to the programming sensing node A and the other terminal connected to a ground voltage terminal.

The programming voltage supplying unit 200 is configured to provide a programming voltage to the programming sensing node A. The programming voltage uses a high voltage VPP. The high voltage VPP has a voltage level at which the fuse EF may be changed to a predefined state.

The programming voltage supplying unit 200 includes an input buffer 210, a NAND gate ND11, and a MOS transistor PM3. The input buffer 210 is configured to receive and output an address for repair. The NAND gate ND11 is configured to receive the output signal of the input buffer 210 and the fuse input signal FI. The MOS transistor PM3 is configured to provide the high voltage VPP, for programming the fuse EF, to the programming sensing node A in response to the output value of the NAND gate ND11.

The transferring unit 300 is configured to transfer the value of the programming sensing node A according to the sensing result of the sensing unit 100. The transferring unit 300 includes a NAND gate ND12, an inverter I3, and a transmission gate T2.

The fuse output signal outputting unit 400 is configured to output the signal transferred from the transferring unit 300 as the fuse output signal FO in response to the fuse input signal FI. The fuse output signal FO provides information regarding whether the fuse is programmed or not.

The fuse output signal outputting unit 400 includes a NOR gate NOR2 and a MOS transistor PM4. The NOR gate NOR2 is configured to receive the inverted signal of the fuse input signal FI and the signal transferred from the transferring unit 300, and output the fuse output signal FO. The MOS transistor PM4 is configured to maintain the other input terminal of the NOR gate NOR2 at the predefined level when the fuse output signal FO has a deactivated voltage level. Accordingly, the output terminal of the NOR gate NOR2 is coupled to the gate of the MOS transistor PM4.

Figure 3:
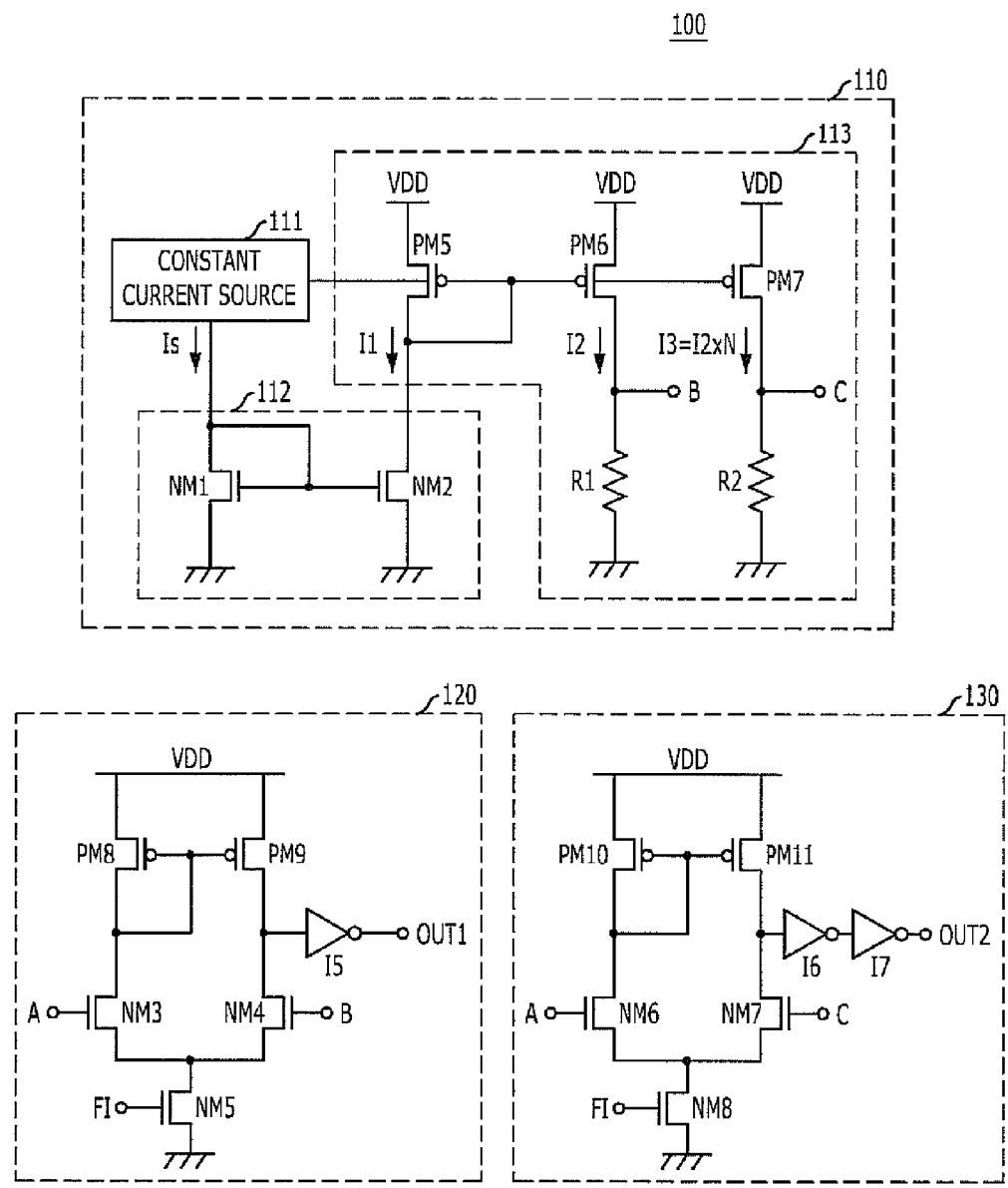
FIG. 3 is a circuit diagram of a sensing unit illustrated in FIG. 2.

FIG. 3 is a circuit diagram of the sensing unit illustrated in FIG. 2.

Referring to FIG. 3, the sensing unit 100 includes a reference value providing unit 110, a first comparison unit 120, and a second comparison unit 130.

The reference value providing unit 110 is configured to provide an upper limit reference value and a lower limit reference value within a predefined range. The first comparison unit 120 is configured to compare the upper limit reference value with a comparison value provided from the programming sensing node A. Furthermore, the first comparison unit 120 provides the activated first sensing signal OUT1 when the comparison value is smaller than the upper limit reference value. The second comparison unit 130 is configured to compare the lower limit reference value with the comparison value provided from the programming sensing node A. Similarly, the second comparison unit 130 provides the activated second sensing signal OUT2 when the comparison value is greater than the lower limit reference value.

The reference value providing unit 110 includes a constant current source 111, a first current mirror 112, and a second current mirror 113. The constant current source 111 is configured to generate a constant current $I_S$, and the first current mirror 112 is configured to provide a first reference current I1 mirrored from the constant current $I_S$. The second current mirror 113 is configured to provide a second reference current I2 mirrored by one time the first reference current I1, and a third reference current I3 mirrored by two times the first reference current I1. The second reference current I2 is provided as the lower limit reference value, and the third reference current I3 is provided as the upper limit reference value. The amount of the third reference current I3 is N times the amount of the second reference current I2.

Herein, the first current mirror 112 and the second current mirror 113 are explained in more detail. As shown in FIG. 3, the first current mirror may include MOS transistors NM1 and NM2. The MOS transistor NM1 is coupled between the constant current source 111 and a ground terminal, while the MOS transistor NM2 is coupled between the second current mirror 113 and the ground terminal. FIG. 3 also shows the second current mirror 113, which may include MOS transistors PM5, PM6, and PM7 and resistors R1 and R2. The MOS transistor PM5 may be coupled between a power supply terminal having a power supply voltage VDD and the first current mirror 112. The MOS transistor PM6 may be coupled between the power supply terminal having the power supply voltage VDD and a node B. The MOS transistor PM7 may be coupled between the power supply terminal having the power supply voltage VDD and a node C. The resistor R1 is coupled between the node B and a ground terminal, while the resistor R2 is coupled between the node C and the ground terminal. Further, the resistors R1 and R2 may be configured to have the same resistance.

The first comparison unit 120 includes a first differential amplifier configured to receive the comparison value provided from the programming sensing node A and the lower limit reference value provided by the second reference current I2 through a node B. The first differential amplifier includes MOS transistors PM8, PM9, NM3, NM4, and NM5.

The second comparison unit 130 includes a second differential amplifier configured to receive the comparison value provided from the programming sensing node A and the upper limit reference value provided by the third reference current I3 through a node C. The second differential amplifier includes MOS transistors PM10, PM11, NM6, NM7, and NM8. Since the first and second differential amplifiers are implemented with a well-known NMOS type differential amplifier circuit configuration, a detailed description thereof will be omitted.

The operation of the semiconductor device according to the embodiment of the present invention will be described below.

First, the programming voltage is provided through the programming sensing node A to the fuse EF. It is sensed whether the value of the programming sensing node A is within a predefined range. When the value of the programming sensing node A is within the predefined range, the value of the programming sensing node A is outputted as the programming result signal of the fuse EF. The fuse output signal FO is outputted as the programming result signal.

The programming voltage is provided to the fuse EF by combining the fuse input signal FI and a data signal corresponding to an address to be repaired. Furthermore, the fuse output signal FO is outputted as the programming result signal of the fuse in response to the fuse input signal FI.

More specifically, the sensing unit 100 receives the value of the programming sensing node A after programming and determines whether the value of the programming sensing node A is within a desired range. When the fuse EF is over-programmed or under-programmed, the transmission gate T2 is not turned on by the output value of the sensing unit 100. In this case, the fuse output signal outputting unit 400 outputs the latched signal of the low level.

The operation of the sensing unit 100 will be described below with reference to FIG. 3. The first current mirror 112 of the reference value providing unit 110 generates the first reference current I1 mirrored from the constant current $I_S$ provided from the constant current source. The second current mirror 113 generates the second reference current I2 mirrored from the first reference current I1, and the third reference current I3 mirrored by N times the second reference current I2.

The first comparison unit 120 compares the comparison value provided by the programming sensing node A with the lower limit reference value determined by the second reference current I2, and outputs the first sensing signal OUT1. Similarly, the second comparison unit 130 compares the comparison value provided by the programming sensing node A with the upper limit reference value determined by the third reference current I3, and outputs the second sensing signal OUT2. When the comparison value provided by the programming sensing node A is in a range between the lower limit reference value determined by the second reference current I2 and the upper limit reference value determined by the third reference current I3, the first and second sensing signals OUT1 and OUT2 are activated to a low level.

When the first and second sensing signals OUT1 and OUT2 are activated to a low level, the transmission gate T2 maintains a turned-on state, and the value of the programming sensing node A is outputted as the fuse output signal. However, when the comparison value provided by the programming sensing node A is out of a range between the lower limit reference value determined by the second reference current I2 and the upper limit reference value determined by the third reference current I3, one of the first and second sensing signals OUT1 and OUT2 is deactivated to a high level. In this case, the transmission gate T2 maintains a turned-off state, and the value of the programming sensing node A is not outputted as the fuse output signal. That is, when the state of the fuse EF after the programming is over-programmed or under-programmed, the transmission gate T2 maintains a turned-off state, and the value of the programming sensing node A is not outputted as the fuse output signal.

Therefore, when the electrical fuse of the semiconductor device in accordance with the embodiment of the present invention is over-programmed or under-programmed, the sensed node value is not outputted as the programming result.

Consequently, it is possible to prevent the incorrect repair process caused by an error occurring during the programming operation.

In accordance with the exemplary embodiments of the present invention, the efficiency of the repair using the fuses may be easily increased because the programmed fuse state is determined in an efficient manner.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a sensing unit configured to sense whether a value of a programming sensing node is within a predefined range;
    a fuse connected to the programming sensing node;
    a programming voltage supplying unit configured to supply a programming voltage to the programming sensing node; and
    a transferring unit configured to transfer the value of the programming sensing node in response to the sensing result of the sensing unit.

2. The semiconductor device of claim 1, wherein the fuse comprises an electrical fuse.

3. The semiconductor device of claim 1, wherein the sensing unit comprises:
    a reference value providing unit configured to provide an upper limit reference value and a lower limit reference value defining the predefined range;
    a first comparison unit configured to compare the upper limit reference value with a comparison value provided from the programming sensing node, and provide an activated first sensing signal when the comparison value is less than the upper limit reference value; and
    a second comparison unit configured to compare the lower limit reference value with the comparison value provided from the programming sensing node, and provide an activated second sensing signal when the comparison value is greater than the upper limit reference value.

4. The semiconductor device of claim 3, wherein the reference value providing unit comprises:
    a constant current source configured to provide a constant current;
    a first current mirror configured to provide a first reference current mirrored from the constant current; and
    a second current mirror configured to provide a second reference current mirrored by one time the first reference current, and a third reference current mirrored by two times the first reference current, the second reference current being provided as the lower limit reference value, and the third reference current being provided as the upper limit reference value.

5. The semiconductor device of claim 4, wherein the first comparison unit comprises a first differential amplifier configured to receive the comparison value and the lower limit reference value.

6. The semiconductor device of claim 5, wherein the second comparison unit comprises a second differential amplifier configured to receive the comparison value and the upper limit reference value.

7. The semiconductor device of claim 1, wherein the transferring unit comprises a transmission gate.

8. The semiconductor device of claim 1, wherein the programming voltage supplying unit comprises:
    an input buffer configured to receive and output data associated with a repair address;
    a logic gate configured to input an output signal of the input buffer and a fuse input signal; and
    a transistor configured to provide a high voltage for fuse programming to the programming sensing node in response to an output value of the logic gate.

9. The semiconductor device of claim 1, further comprising a fuse output signal outputting unit configured to output the value of the programming sensing node transferred from the transferring unit as a fuse output signal, which provides information regarding whether the fuse is programmed, in response to a fuse input signal.

10. The semiconductor device of claim 9, wherein the fuse output signal outputting unit comprises:
    a logic gate configured to receive the fuse input signal through a first input terminal and the value of the programming sensing node transferred from the transferring unit through a second input terminal, and output the fuse output signal; and
    a transistor configured to maintain the second input terminal of the logic gate at a predefined voltage level when the fuse output signal is at a deactivated voltage level.

11. A method for operating a semiconductor device which includes a fuse and performs a repair process, the method comprising:
    providing a programming voltage to the fuse through a programming sensing node;
    sensing whether a value of the programming sensing node is within a predefined range; and
    transferring the value of the programming sensing node as a fuse programming result signal when the value of the programming sensing node is within the predefined range.

12. The method of claim 11, wherein the providing of the programming voltage to the fuse comprises:
    combining a fuse input signal and a data signal corresponding to an address to be repaired; and
    providing the programming voltage to the fuse.

13. The method of claim 12, wherein the fuse programming result signal is outputted in response to the fuse input signal.

* * * * *